(12) United States Patent
Schmidt

(10) Patent No.: US 11,285,669 B2
(45) Date of Patent: Mar. 29, 2022

(54) CONTAINER FOR USE IN STEREOLITHOGRAPHIC SYSTEMS

(71) Applicant: DENTSPLY SIRONA INC., York, PA (US)

(72) Inventor: Christian Schmidt, Bensheim (DE)

(73) Assignee: DENTSPLY SIRONA Inc., York, PA (US)

( * ) Notice: Subject to any disclaimer, the term of this patent is extended or adjusted under 35 U.S.C. 154(b) by 363 days.

(21) Appl. No.: 16/621,525

(22) PCT Filed: Jun. 21, 2018

(86) PCT No.: PCT/EP2018/066528
§ 371 (c)(1),
(2) Date: Dec. 11, 2019

(87) PCT Pub. No.: WO2018/234426
PCT Pub. Date: Dec. 27, 2018

(65) Prior Publication Data
US 2020/0171746 A1    Jun. 4, 2020

(30) Foreign Application Priority Data

Jun. 21, 2017 (DE) .......................... 102017210384.1

(51) Int. Cl.
| | |
|---|---|
| *B29C 64/245* | (2017.01) |
| *B29C 64/255* | (2017.01) |
| *B29C 64/124* | (2017.01) |
| *B29K 105/00* | (2006.01) |
| *B33Y 30/00* | (2015.01) |

(52) U.S. Cl.
CPC .......... *B29C 64/245* (2017.08); *B29C 64/124* (2017.08); *B29C 64/255* (2017.08); *B29K 2105/0058* (2013.01); *B33Y 30/00* (2014.12)

(58) Field of Classification Search
CPC ... B29C 64/106; B29C 64/124; B29C 64/255; B33Y 10/00; B33Y 30/00
See application file for complete search history.

(56) References Cited

U.S. PATENT DOCUMENTS

| | | |
|---|---|---|
| 5,391,072 A | 2/1995 | Lawton |
| 5,545,367 A | 8/1996 | Bae |
| (Continued) | | |

FOREIGN PATENT DOCUMENTS

| | | |
|---|---|---|
| CN | 105452958 A | 3/2016 |
| CN | 105922587 A | 9/2016 |
| (Continued) | | |

OTHER PUBLICATIONS

International Search Report; PCT/EP2018/066528; Sep. 13, 2018 (completed); dated Sep. 20, 2018.

(Continued)

*Primary Examiner* — Joseph S Del Sole
*Assistant Examiner* — Manley L Cummins, IV
(74) *Attorney, Agent, or Firm* — Denstply Sirona Inc.

(57) ABSTRACT

The invention relates to a container for holding a photosensitive liquid for use in a stereolithographic system in which a reference layer is exposed to radiation for the layer-by-layer or continuous creation of workpieces. At least one element of the container which is directly adjacent to the reference layer consists of at least one material which is at least partially transparent to the radiation and at least some of which has structures and/or pores which can receive and discharge, preferably also store, an inhibitor and/or an inhibitor mixture. Therefore, the element is not just able to supply the inhibitor but to a significant extent consists of the inhibitor itself, as a result of which the supplied flow is equalized or homogenized. Rapid or even continuous 3D printing is thus made possible in a cost-effective manner.

16 Claims, 4 Drawing Sheets

(56) References Cited

U.S. PATENT DOCUMENTS

| | | |
|---|---|---|
| 2013/0252178 A1 | 9/2013 | Mcleod |
| 2013/0292862 A1 | 11/2013 | Joyce |
| 2013/0295212 A1 | 11/2013 | Chen |
| 2015/0034007 A1 | 2/2015 | Fischer |
| 2015/0309473 A1 | 10/2015 | Spadaccini |
| 2015/0360419 A1 | 12/2015 | Willis |
| 2016/0136889 A1* | 5/2016 | Rolland ................. B33Y 80/00 264/1.27 |
| 2017/0151718 A1 | 6/2017 | Rolland |
| 2019/0016051 A1* | 1/2019 | Lin ....................... B29C 64/291 |

FOREIGN PATENT DOCUMENTS

| | | |
|---|---|---|
| CN | 205573042 U | 9/2016 |
| CN | 106042388 A | 10/2016 |
| DE | 202013103446 U1 | 10/2013 |
| DE | 102013215040 A1 | 2/2015 |
| EP | 1863070 A1 | 12/2007 |
| EP | 1253002 B1 | 3/2013 |
| WO | 200172501 A1 | 10/2001 |
| WO | 2006080516 A1 | 8/2006 |
| WO | 2016149097 A1 | 9/2016 |
| WO | 20160149104 A1 | 9/2016 |

OTHER PUBLICATIONS

Written Opinion of the International Searching Authority; PCT/EP2018/066528; Sep. 13, 2018 (completed) dated Sep. 20, 2018.
International Preliminary Report on Patentability; PCT/EP2018/066528; Sep. 13, 2018 (completed); mailed Sep. 20, 2018.
Chinese Search Report; Application No. 201880041414.5 dated: Jul. 19, 2021.

* cited by examiner

CONTAINER FOR USE IN STEREOLITHOGRAPHIC SYSTEMS

TECHNICAL FIELD

The invention relates to a part of a stereolithographic system.

In a stereolithographic system, a three-dimensional body is produced from a photosensitive substance by layer-by-layer or continuous stacking of layers or layer information.

In stereolithography according to the overhead method, the first layer of the workpiece, i.e. prior to the first step of the actual generative process, is transferred to a carrier (e.g. attached by means of a polymerization process). The carrier is able to perform a movement relative to the focal plane or reference layer. A next process step ensures that new material of the photosensitive substance can flow into the reference layer under the most recently produced layer or polymerization front. This can be achieved by a single lifting movement, for example, or a combination of lifting movements. The replenished photosensitive substance can then again cure under exposure to light.

In stereolithography according to the overhead method, the reference layer is directly below the workpiece, above the bottom of the tank or container in which the liquid starting material (e.g. photopolymerizable synthetic resin) is located.

When lifting the workpiece in order to be able to cure the next layer, it must be ensured that the last, just cured layer of the workpiece does not adhere to the bottom of the tank.

BACKGROUND OF THE INVENTION

A variety of solutions, which permit the use of inhibitors to accelerate the process up to a continuous manufacturing process, are known from the state of the art.

The use of inhibitors to form an inert intermediate phase within a photoreactive resin has been described by Lawton in U.S. Pat. No. 5,391,072, for example. It describes the use of a Teflon AF film or fluoropolymers, which are mounted on a carrier in order to allow a gaseous inhibitor to flow from the outside between the carrier and the film. The inhibitor (e.g. oxygen) permeates the Teflon AF film, thus producing an unreactive inhibition layer within or directly below the overlying photoreactive reference layer. A lubricating film is formed, which can significantly facilitate the release of the workpiece from the bottom of the tank, thus accelerating the process.

Fricke's publication (WO 01/72501 A1) describes a stereolithographic system which is capable of producing a workpiece continuously, i.e. without breaks between the layers. The polymerization process is not interrupted and the workpiece is continuously drawn from the liquid photoreactive material at a speed correlated with the kinetics of the reaction front. In this context, Fricke also describes the use of mask exposure systems, which make it possible to generate the layer information in every point of the exposure plane or reference layer at the same time. Fricke achieves the formation of the unreactive phase necessary for a continuous process by cooling the photoreactive liquid, so as to thus create a reaction gradient within the photoreactive substance. In this way, printing speeds of 1 mm/s can be achieved.

Willis' publication, US 2015/0360419 A1, discloses a stereolithographic system with a tank consisting of a material that has a specific oxygen permeability. This allows the formation of an inhibitor-containing layer, which leads to the reduction of the separation force.

Teflon AF or a fluoropolymer are used as the oxygen-permeable material. A two-phase system, in which a transparent, chemically inert liquid is located between the container and the photoreactive substance, is described as well.

The publication DE 20 2013 103 446 U1 describes the use of a semipermeable membrane to create an inhibition layer within the photoreactive liquid in order to minimize the separation forces.

In FIG. 13a, Young's patent specification U.S. Pat. No. 5,545,367 discloses a design consisting of a fluoropolymer and a structured carrier. A gaseous inhibitor can flow in the channels formed by the carrier, for example, and thereby minimize the adhesion of the layers of the workpiece to the upper side of the carrier by forming an inhibitor-containing layer.

A variety of other publications, such as US 2013/0252178 A1, US 2015/0309473 A1, US 2013/0292862 A1 and EP 1 253 002 B1 describe the use of PDMS (silicone) as the lower boundary of the reference layer, e.g. as the bottom of the tank. By diffusion, the oxygen dissolved in the silicone forms a very narrow inhibition layer within the photoreactive material and thus reduces the adhesive forces. The biggest drawback is the low chemical and mechanical stability of the PDMS layer.

In US 2013/0295212 A1, Yong also describes the use of PDMS as the separation medium and the associated formation of an inhibition layer, and demonstrates a metrological correlation between the inhibition layer and the separation force. The reduction of the separation forces and the shearing of the tank from the workpiece surface made it possible to accelerate the manufacturing process in comparison to conventional systems.

Tumbleston's publication WO 2016/149097 A1 describes a continuous manufacturing process, in which an intermediate phase is likewise formed within the photoreactive material. This is made possible by the use of a Teflon AF film or a membrane placed over a base. As already described by Lawton, the Teflon AF film can be connected to the base. The option of not connecting the film to the base, in order to thereby provide an additional mechanical release process, is demonstrated as well. Among other things, the base consists of a transparent material which is not permeable to the inhibitor, e.g. glass. The non-permeable layer can sometimes also be made permeable to a certain extent by structuring or processing.

The publication DE 10 2013 215 040 A1 describes an overhead stereolithographic system, the design of which is especially compact as a result of optical deflecting devices in which total reflection occurs. A semipermeable film that spans a hollow space serves to supply the inhibitor.

The publication US 2017/0151718 A1 describes stereolithography methods able to produce articles made of polyurethane and related substances. This can also include the use of overhead arrangements. The base plate, through which an inhibitor can be supplied in these cases, can hereby comprise a layer of Teflon AF, for example, or a different semipermeable film. Alternatively or additionally, the publication describes the production of the base plate from a porous or microporous glass, for example.

All of the known solutions have the disadvantage that they are not freely scalable in size and typically require complicated optical manufacturing processes, for example to form channel structures. Furthermore, even though substances such as PDMS are basically oxygen permeable, the behavior of this permeability is opposite to that of the degree of crosslinking. This in turn has a significant determining effect on the mechanical and the chemical stability. Self-supporting PDMS arrangements have the disadvantage that they are flexible; consequently, buckling during the manufacturing process cannot be prevented. On the other hand, rigid materials such as glass have mechanical and optical advantages, but provide no capability for the diffusion of a gaseous inhibitor, so that there is no formation of an inhibition layer. The use of Teflon AF as a film or as a plate material is possible. The cost of Teflon AF is very high, however, in particular in plate form. The oxygen permeability would moreover also decrease as thickness of the plate, and the mechanical stability associated with it, increases. The use as a (self-supporting) film fails because the film sags. Therefore, to make a fast, perhaps even continuous, manufacturing process possible, it requires a base.

SUMMARY OF THE INVENTION

The goal of the invention presented here is to create an arrangement that overcomes the drawbacks of the known solutions and allows easy supply of the inhibitor with a sufficiently mechanically rigid base.

Solution

Said object is solved by the subject matter of the independent claim. Advantageous further developments of the subject matter of the independent claim are characterized in the subclaims. The text of all the claims is hereby incorporated into the content of this specification by reference.

The use of the singular is not intended to exclude the plural, which also applies in reverse unless disclosed otherwise.

To achieve the object, the invention proposes a container for holding a photosensitive liquid and provided for use in a stereolithographic system in which a reference layer is exposed to radiation for the layer-by-layer or continuous creation of workpieces. At least one element of the container which is directly adjacent to the reference layer consists of at least one material which is transparent to the radiation and has structures and/or pores which can store or receive and discharge an inhibitor and/or an inhibitor mixture.

The material of the element of the container is preferably a solid of which at least 70 vol %, preferably at least 80 vol %, preferably at least 90 vol %, preferably at least 95 vol %, preferably at least 98 vol %, preferably at least 99 vol %, consists of open-celled pores. The element of the container is therefore made of a material that typically consists of 80 or more percent gas (e.g. air). Therefore, if synthetic resin is used for the stereolithography, for example, the material contains an inhibitor, for example oxygen. The material is nonetheless strong enough to make the bottom of a tank or the lid of a container out of it, whereby said bottom or lid typically has a thickness of 100 μm to 1 cm, preferably 3 mm, depending on the size of the container.

In this configuration, the element for the radiation used in stereolithography, e.g. UV radiation, is at least partially transparent. By contrast, for the liquid in the container, typically a liquid, photopolymerizable synthetic resin, the material is impermeable. The region of the bottom of the tank, above which the reference layer is located, can thus not only supply the inhibitor, but consists to a significant degree of the inhibitor itself.

The same applies when it is used as the lid of the container. As a result, a possibly spatially restricted inhibitor inflow can be balanced or homogenized. In a sense, the bottom of the tank or the lid of the container stores the gaseous inhibitor. Special supply lines or channels, which serve to supply the inhibitor, can therefore be omitted when configuring the bottom of the tank or the lid of the container. The inhibitor can instead be supplied and/or removed by changing the ambient pressure or temperature. It is possible to make the entire bottom or lid or only the part of the bottom of the tank or the lid of the container located below/above the reference layer from the material. This region can therefore be surrounded and/or supported by conventional structural materials, which for their part have little or no permeability to an inhibitor.

Overall, therefore, this results in a significantly simpler and more cost-effective configuration of the container or the cartridge than when other semipermeable substances are used to supply the inhibitor. This design is also virtually freely scalable, so that even larger stereolithographic systems can easily be equipped with it. The supply of a gaseous inhibitor to the photoreactive material in the container is ensured, so that a reaction gradient develops below or above the reference layer and, in particular directly on the bottom of the tank or the lid of the container, there is no adhesion to said bottom or lid. This is a prerequisite for a fast, preferably continuous, stereolithography process. Mechanical shearing or shaking devices for separating the just solidified layer from the bottom of the tank or the lid of the container can be omitted completely.

The container for holding the photosensitive liquid can preferably be a tank for use in a stereolithographic system operating according to the overhead method. In that case, the element of the tank directly adjacent to the reference layer is at least a part of the bottom of the tank.

The container can, however, also be used for holding the photosensitive liquid for use in a reflected-light stereolithographic system. In that case, the element of the container directly adjacent to the reference layer is at least a part of the lid of the container.

The pore size of the material is preferably between 2 and 200 nm, preferably between 2 and 50 nm, particularly preferably between 30 and 50 nm. This pore size is smaller than the wavelength of the light (typically UV light) used for the polymerization. Consequently, there is very little light scattering. However, the pores are also large enough to be able store and transport air, oxygen or Lhe inhibitor. They are furthermore small enough to not allow the photopolymerizable liquid to penetrate into the material.

Preferred materials for the element are nanoporous composites, nanoporous glass or aerogels.

Improved material properties, e.g. greater transparency to the radiation used in stereolithography, can be achieved when the aerogel is doped (also known as X-aerogel).

Improved mechanical properties (i.e. stability and/or strength) are in particular obtained when the aerogel is doped with nanocellulose, whereas increased chemical resistance is achieved when the aerogel is doped with polydimethylsiloxane (PDMS).

A particularly simple structure is achieved, when the part of the bottom of the tank consisting of an aerogel is designed as a single layer. This embodiment is also particularly cost-effective. This can easily be achieved with a correspondingly doped aerogel.

A structure, in which the part of the bottom of the tank or the lid of the container made of an aerogel consists of at least two layers, is more versatile. At least one layer can also consist of a conventional material, e.g. glass, that can, for example, be used for stabilization. In the case of a layer made of inhibitor-impermeable material, said layer has to be disposed on the side of the remaining layers facing away from the photopolymerizable liquid so as to not block the flow of the inhibitor into the container. In this case, however, variants in which the layers consist of different semipermeable materials, all of which are at least limitedly permeable to the inhibitor, are more advantageous. The layers can be adhesively bonded to one another with a silicone, for example, or there could be an entire layer made of silicone. Other ways of connecting the layers, e.g. clamping, tensioning or the like, can be taken into consideration as well. An arrangement with multiple layers, all of which consist of aerogels, is also possible, whereby each layer can be doped differently, e.g. to achieve a particularly high chemical stability on the outer surfaces and, in the case of an inner layer, a specific mechanical strength of the bottom of the tank or the lid of the container. In particular sandwich-like structures are possible as well. Layers of Teflon AF can also be beneficial. Teflon AF has the advantage of having a significantly higher permeability for oxygen than for nitrogen. If air is used as a carrier for the inhibitor, which is advisable for cost and manageability reasons, a Teflon AF layer can thus ensure that predominantly the inhibitor, oxygen, is supplied to the interior of the container, and not mainly nitrogen which, in this case, does not achieve any meaningful effect. A suitable multilayer arrangement can make storage and permeability for the inhibitor possible that is tailored to the particular application.

The element can be made more chemically stable by coating the part of the bottom of the tank or the lid of the container made of the material on the inner side of the tank. This coating can have the form of a membrane, for example. It is particularly advantageous if the coating consists of a fluoropolymer, for example a Teflon AF film. Alternatively, it is advantageous if the coating consists of a silicone. With these coatings, similar advantages can be achieved as with a multilayer structure as described above. This also simplifies production, because the coating can be applied to the surface of the part of the bottom of the tank or the lid of the container consisting of the aerogel in the form of a film. Adhesive bonding, clamping or stretching are preferred mounting options for such a film. However, coatings with Teflon AF, PDMS (a silicone) or PTMSP can advantageously be melted on, which is facilitated by the temperature insensitivity of aerogels. PDMS stands for polydimethylsiloxane and PTMSP for poly(1-trimethylsilyl-1-propyne), both of which have some oxygen permeability.

If the part of the bottom of the tank or the lid of the container consisting of the aerogel is configured such that the pore size of the element or material changes in at least one direction over its spatial extent, the intake and/or release of the inhibitor, e.g. oxygen, can be optimized. The pore size preferably changes in the direction of the photopolymer, for example decreasing from a pore size in the micrometer range on the side facing toward the ambient air and to a pore size in the nanometer range when approaching the photopolymerizable liquid, or vice versa. An at least partially closed volume is advantageously formed on the side of the element facing away from the photopolymer, which makes it possible to at least partially control state variables and the composition of the atmosphere in the volume. This makes it possible to at least partially control state variables such as pressure, temperature, inhibitor concentration in and around the element, and also the composition of the atmosphere of the volume, preferably independently and/or as a function of the environmental conditions. This makes it possible to control the flow of the inhibitor into the reference layer in a targeted manner.

In another embodiment comprising a packaging, the tank described above is filled with a photosensitive liquid for use in a stereolithographic system. The tank is furthermore inside the packaging, which is designed such that the photosensitive liquid is held in the tank. The packaging can include a peelable cover layer, for example, perhaps made of plastic, which closes the tank. In the packaging, the photosensitive liquid is shielded from the radiation used for stereolithography. A tank, or even a cartridge, designed in this manner can be used as a consumable for already existing stereolithographic systems.

It is often useful to, at least in some regions, mechanically support the element with a carrier material. Of course, the carrier material has to be transparent to the used radiation. The element will preferably be connected to the carrier material, whereby the carrier material does not necessarily have to be permeable to the inhibitor. A sufficiently thick and thus sufficiently mechanically stable carrier glass can be used, for example, to which a thin aerogel with a thickness of merely 1 mm is applied.

The object is further achieved by a stereolithographic system, which operates according to the overhead method, having at least one tank for holding a photosensitive liquid, as has been described above.

Additional details and features emerge from the following description of preferred design examples in conjunction with the subclaims. The respective features can hereby be realized individually or several in combination with one another. The possible ways to achieve the object are not limited to the design examples. Range specifications, for example, always include all (not mentioned) intermediate values and all conceivable subintervals.

One design example is shown schematically in the figures. The same reference numerals in the individual figures identify identical or functionally identical elements, or more specifically elements that correspond to one another with respect to their functions.

BRIEF DESCRIPTION OF THE DRAWINGS

Specifically, the figures show.

DETAILED DESCRIPTION OF THE INVENTION

Figure 1:
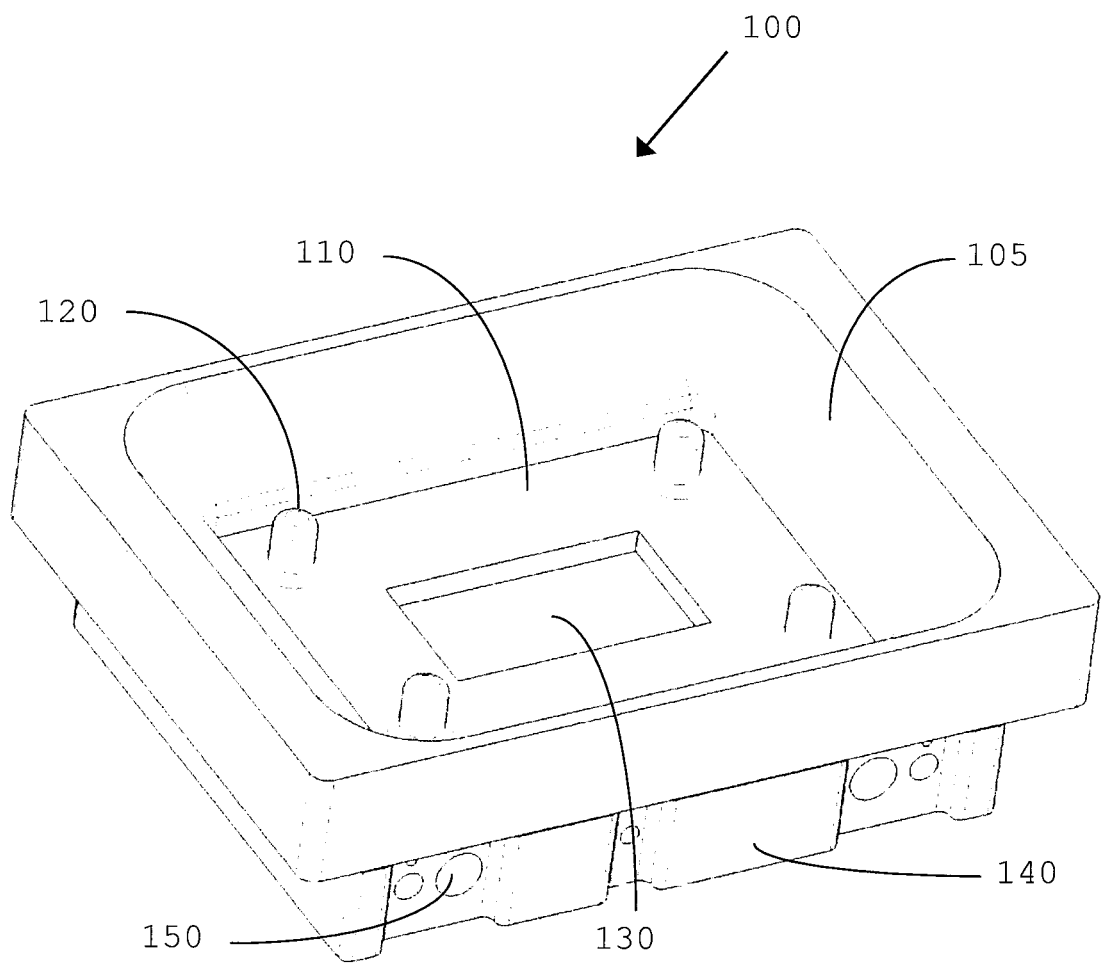
FIG. 1 a perspective view of a tank according to the invention.

FIG. 1 shows a tank 100 according to the invention for use in an overhead stereolithographic system. In this design, the wall 105 and the outer region 110 of the bottom of the tank, above which the reference layer is not located, can be made of a conventional material. Four covers 120 for mounting screws are located in this region. The region in which the reference layer is located above the bottom of the tank during operation is in the middle of the tank. In the conventionally manufactured bottom of the tank 110, there is a recess, below which there is a block 130 that preferably consists of an aerogel or of one of the above-described combinations of different layers including at least one aerogel. This block is preferably approximately 3 mm thick, with a side length of several centimeters. It is held by the substructure 140 of the tank, which can also be made of a conventional material. The substructure is bolted to the upper part 110 of the tank, as a result of which the aerogel block 130 is secured below the reference layer. Supply channels 150 are provided to facilitate or enable the supply of the inhibitor, typically oxygen, possibly in the form of air, through the aerogel block. For stabilization purposes, and to protect the aerogel block from mechanical damage, it is thus possible to close the structure off at the bottom e.g. with a sheet of glass (not depicted). The substructure 140 of the tank 100 can alternatively also be open to the bottom.

Figure 2:
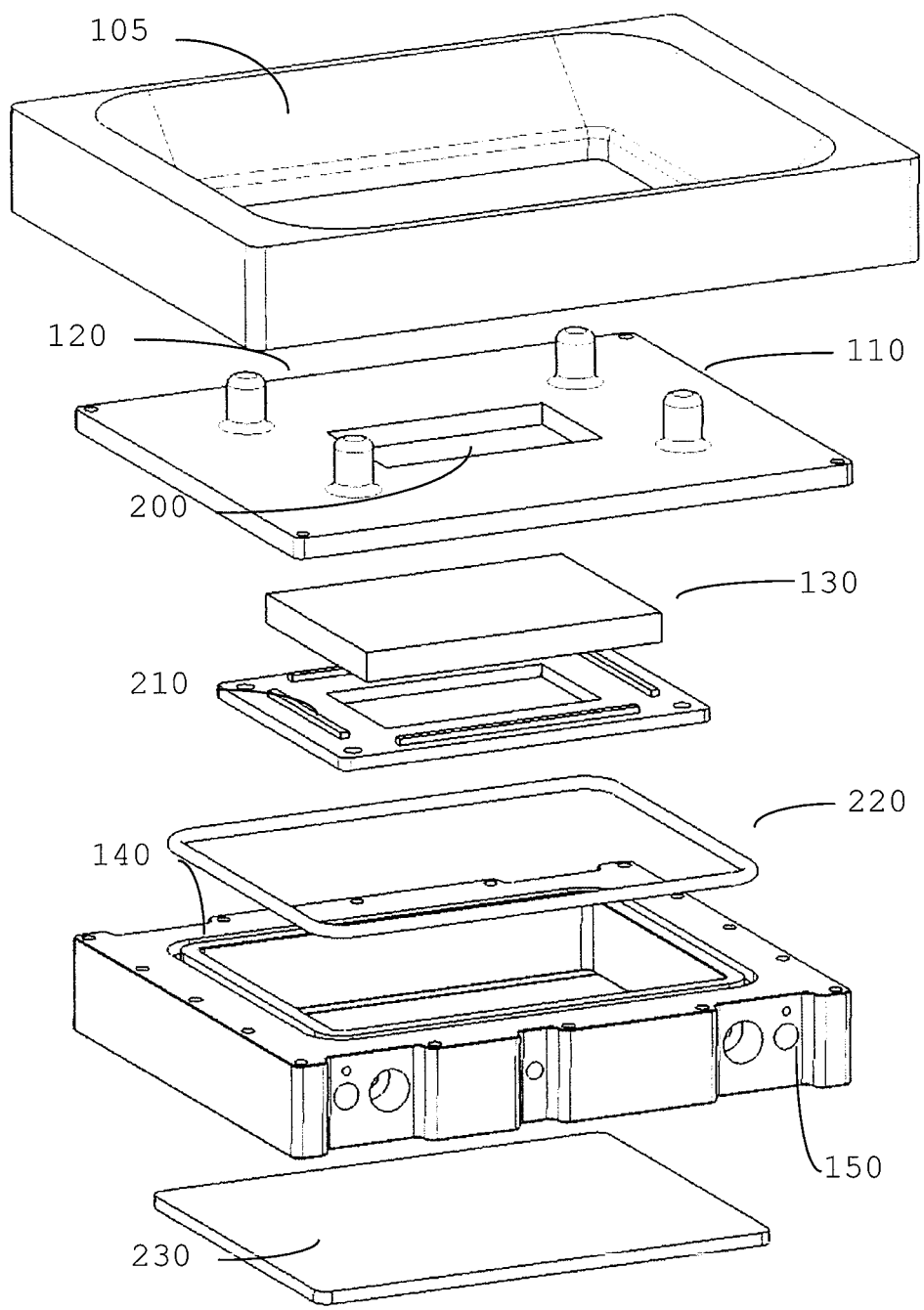
FIG. 2 the tank of FIG. 1 in an exploded view.

The individual components of the tank according to the invention can be seen in the exploded view in FIG. 2. The wall 105 and the outer region 110 of the bottom of the tank can be made of a conventional material. The outer region 110 of the bottom of the tank also comprises the covers 120 for the mounting screws. In the area in which the reference layer is located during operation, this component has a recess 200, below which the aerogel block 130 is attached. The holder 210 serves to secure this block 130 and is screwed to the outer region 110 of the bottom of the tank by means of the (not depicted) mounting screws. For sealing purposes, there is also an O-ring 220 which, despite the multipart design, prevents leakage of the stereolithography liquid from the tank 100 and escape of the gaseous inhibitor, thus creating a sealed chamber. These parts are surrounded by the tank substructure 140, which can comprise supply channels 150 for air or oxygen, for example. These are necessary if the structure is closed off at the bottom by a sheet of glass 230 or the like. A suitable material (e.g. special glass, suitable transparent plastic, float glass, sapphire glass, PMMA or plexiglass, or the like) is selected, which is transparent to the radiation, e.g. UV radiation, used in stereolithography.

Figure 3:
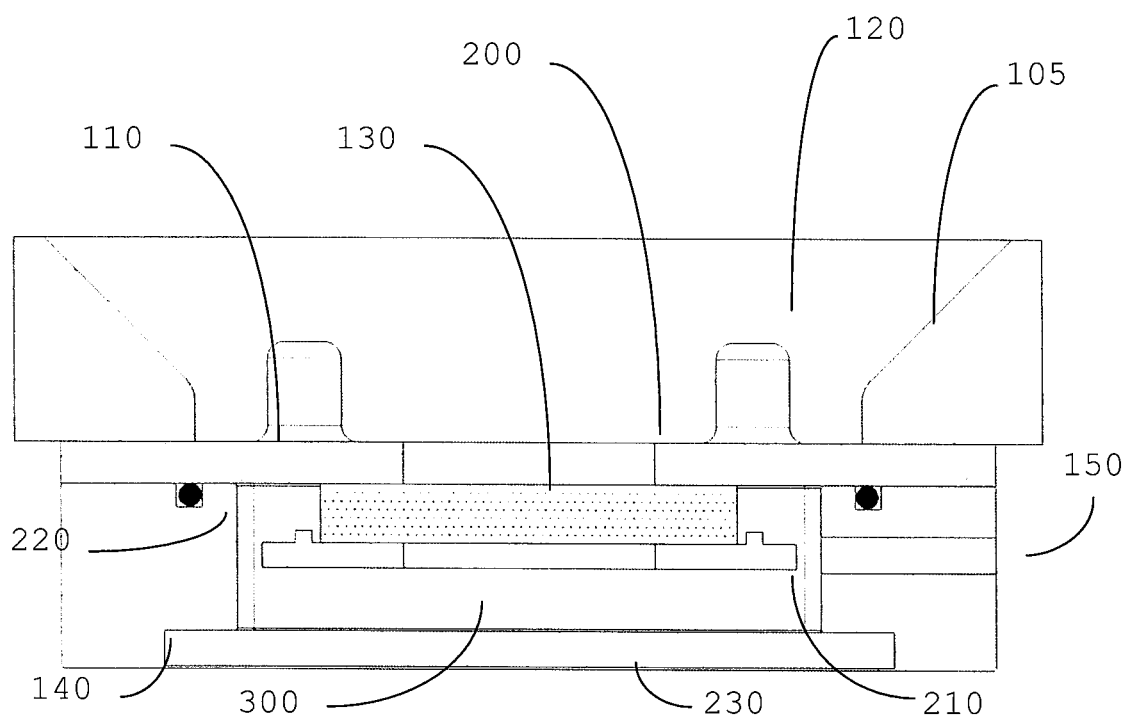
FIG. 3 a schematic sectional view through the tank of FIGS. 1 and 2.

FIG. 3 shows the same tank in a schematic cross section. It can further be seen here that, between the aerogel block 130 secured with the holder 210 and the sheet of glass 230 in the illustrated embodiment, there is a hollow space 300, which can be supplied with inhibitor gas via the supply channels 150. This arrangement with the hollow space 300 is advantageous, because a larger outer surface of the aerogel block 130 is able to receive the inhibitor than if the block is more completely enclosed; in that case only the cross-sectional area of the supply channels 150 would be available.

Figure 4:
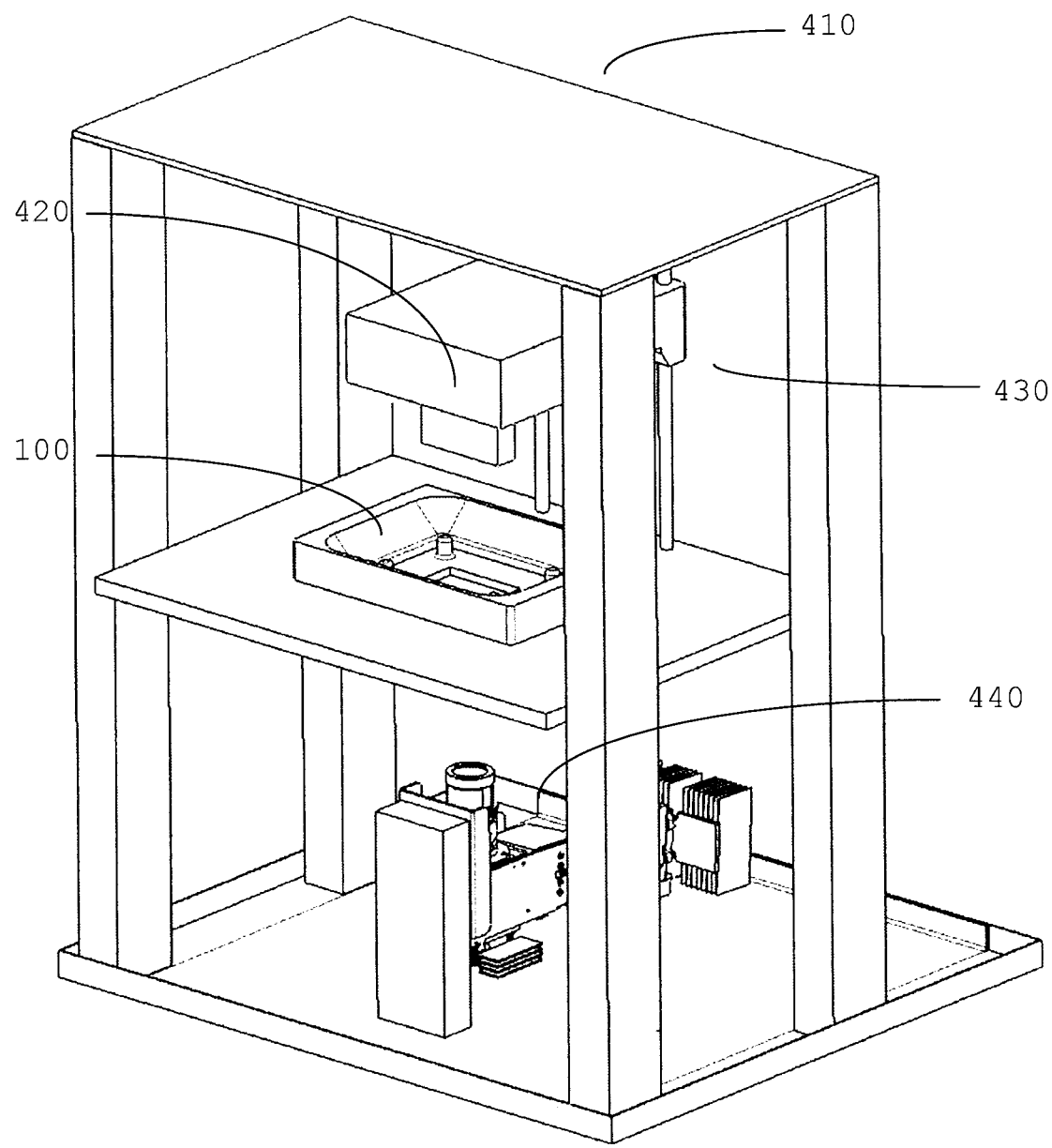
FIG. 4 a simplified perspective view of a 3D printer having a tank according to the invention.

The use of a tank 100 according to the invention in a stereolithographic system 410 that operates according to the overhead method, can be seen in FIG. 4. The suspension device 420, to which the workpiece to be produced (not depicted) is attached, is positioned above the tank. The height adjustment 430 causes the suspension device to move up layer by layer or continuously during operation, whereby the workpiece is lifted layer by layer, for example, so that one perspective new layer can be solidified in the reference layer between the workpiece and the bottom of the tank. The illumination unit 440 ensures that the radiation necessary for solidifying the used liquid is focused on the appropriate locations (through the bottom of the tank). As long as the apparatus is not too large, complex mechanical shaking or shearing devices for the purpose of separating the solidified material from the bottom of the tank can be omitted.

Numerous modifications and further developments of the described design examples can be realized.

The object is thus achieved by a stereolithographic system of the type described above, in which a multipart structure of the reference surface (base) is created that is at least partially transparent to the radiation that triggers curing, and at least a part or a layer is made of a material which consists significantly, i.e. for example at least 30%, 40%, 50% preferably 80%, 90% or more, of a gas or gas mixture (e.g. air), in which at least one inhibitor is dissolved up to a specific percentage, or consists entirely of an inhibitor (for example, oxygen) but, together with a matrix, is nonetheless able to form a spatial structure or a body. Body is understood here to be any geometric configuration, a possible body may be a cuboid, for example, having a thickness of 10 mm and edge lengths of 100 mm.

Instead of a material that does not consist substantially of gaseous components (such as glass, fluoropolymer, silicone), the solution according to the invention provides a base body to which a protective membrane can be applied, the volume of which consists predominantly of a gas or gas mixture or is predominantly filled or saturated by said gas or gas mixture and is at least partially transparent to the used electromagnetic radiation.

This design can ensure that inhibitor cannot only be conveyed and, if necessary, stored by the base, but rather that said base itself can consist to a large extent of the inhibitor. This base can be enriched with different materials, such as PDMS (silicone), in order to affect the transparency and the mechanical and chemical stability. The base can also be connected to a membrane having a degree of selectivity, for example by using an adhesive such as silicone to improve the chemical stability. Since the base itself has a high permeability for possible inhibitors, or can even consist almost completely of inhibitor (for example to more than 40%), such as oxygen, possible and normally necessary inhibitor supply lines, such as surfaces or channels, can be reduced to a minimum. A structure can consequently be realized, in which the base can additionally be supported or surrounded by conventional structural materials having a low inhibitor permeability. Inhibitor can furthermore be supplied via only a small area of the lateral surface, if at all. This permits a simple structural solution and integration into a technical component, such as a tank, a cartridge or other embodiments, which are suitable for holding a photoreactive material and processing it in a stereolithographic system.

The invention also permits a virtually geometrically freely scalable design of the base because, in contrast to other materials, the base itself already consists to a large extent of inhibitor or can hold inhibitor, and geometrical restrictions resulting from a minimum necessary permeability of conventional materials can be overcome.

Base thicknesses in the millimeter or centimeter range can therefore easily be realized, so as to thus guarantee sufficient rigidity even for large dimensions. The base can advantageously be shaped such that the supply of the inhibitor out of itself, and also from the surroundings or a special process chamber and from all sides and directions is possible. The inhibitor can be supplied and/or removed by changing the ambient pressure. According to a further development aspect of the invention, the base can comprise channel structures that make a flow of inhibitor possible, whereby said channel structures can be produced in one manufacturing process along with the base itself (for example by casting).

According to the invention, the flow of inhibitor takes place through/via the entire surface of the base through the protective membrane into the photoreactive material, whereby the supply of inhibitor does not have to be uniform over the entire or part of the surface.

The base preferably consists of a so-called aerogel, nanofoam or an X-aerogel or related materials, which can comprise a nano-, micro- and mesoporous structure or a combination thereof (for example having a pore diameter of 2 to 200 nm) that is at least partially transparent to the used radiation. The base particularly preferably consists of a composite of an aerogel, X-aerogel or hybrid forms of an aerogel and a fluoropolymer protective layer (Teflon AF) or some other permeable membrane that is coupled to the base.

According to the invention, the aerogel base can be produced by means of supercritical drying.

According to the invention, the base can consist of at least one material, preferably a combination of materials, preferably a combination of different aerogel materials.

According to the invention and corresponding to the combination of materials, the density of the base can include density gradients and jumps within the base as well as throughout the composite body.

To support the release process, the base can be moved spatially relative to the component carrier (component platform). A tilting of the base relative to the component carrier can take place and also a translation.

According to the invention, the base comprises channels that serve to control the temperature of the surface of said base. This is useful because of the very good insulation of the used material types.

Glossary

3D Printing, Stereolithography 3D printing is a generative manufacturing process, referred to in accordance with the structural principle as additive manufacturing. In 3D printing, three-dimensional workpieces are built up layer by layer. Creation from one or more liquid or solid materials is computer-controlled according to specified dimensions and shapes (CAD). Hardening or melting processes take place during creation. Typical materials for 3D printing are plastics, synthetic resins, ceramics or metals. Stereolithography is the variant of this, in which a workpiece is built up layer by layer using materializing (raster) points. The manufacturing of one part or multiple parts at the same time usually takes place fully automatically using computer-generated CAD data.

For example, a photocuring plastic (photopolymer), for example acrylic, epoxy or vinyl ester resin, is cured in thin layers by a suitable light source shining down from above, e.g. a laser (or also a pixel-based, possibly incoherent light source, e.g. a MEMS or DLP chip). The procedure takes place in a bath filled with the base monomers of the photosensitive plastic. After each step, the workpiece is lowered into the liquid a few millimeters and returned to a position that is lower than the previous one by the amount of a layer thickness. The liquid plastic over the part is evenly distributed (by means of a wiper) or automatically pulled in due to the presence of a lid. The light source, which is controlled by a computer via movable mirrors, then moves pixel by pixel along the new layer over the surfaces to be cured. The layer or image information can alternatively also be produced simultaneously in all areas, e.g. using a mask or the projection of an image within the projection surface. The next step takes place after curing, thus gradually creating a three-dimensional model.

For larger workpieces, this procedure has the disadvantage that the bath has to be correspondingly deep and filled with an unnecessarily large quantity of the liquid plastic material. This can be remedied by using the overhead method (see there). (Source: https://de.wikipedia.org/wiki/3D-Druck and https://de.wikipedia.org/wiki/Stereolithografie.)

Aerogel

Aerogels are highly porous solids, up to 99.98% of the volume of which consists of pores. There are different types of aerogels, whereby silicate-based aerogels are the most common. Other materials, e.g. plastic- or carbon-based materials, are used in special cases. All metal oxides, polymers and a number of other materials can generally be used as a starting point for aerogel synthesis by means of a sol-gel process.

Aerogels have a strongly dendritic structure, i.e. a branching of particle chains with a large number of spaces in the form of open pores. These chains comprise contact points, resulting in the image of a stable three-dimensional network. Its aggregates have a fractal dimension, so they are self-similar to a certain extent.

The pore size is in the nanometer range and, at up to 1000 $m^2/g$, the inner surfaces can be exceptionally large. Aerogels can consequently be used, among other things, as insulation or filter material. There is furthermore the option to incorporate biologically active molecules, proteins or even whole cells. There are 14 entries for aerogels in the Guinness Book of Records for material properties, including "Best Insulator" and "Lightest Solid." As the record holder in the category "Least Dense Solid," aerographite having 99.99% air and 0.01% graphitic carbon was developed in 2012.

The high optical transparency, together with a refractive index of approximately 1.007 to 1.24 and a typical value of 1.02, makes aerogels interesting also from an optical perspective. A silicate aerogel appears milky blue against a dark background, because the silicon dioxide scatters the shorter wavelengths (i.e. the blue portions of white light) more than the longer wavelength radiation. Despite its transparent appearance, the aerogel feels like hard plastic foam.

The individual particles of the silicate aerogels are approximately 1-10 nm in size, the distance between the chains is approximately 10-100 nm. Silicate aerogels have cylindrical, so-called mesopores. These are quite easily accessible and by definition have a diameter of 2-50 nm, whereby the porosity is in the 80-99.8% range. The bulk density consequently ranges from 0.16-500 $mq/cm^3$ with a typical value of 100 $mg/cm^3$, whereas the true density is 1700-2100 $mg/cm^3$. Therefore, silicate aerogels have a very high specific surface area of 100-1,600 $m^2/g$ and a typical value of 600 $m^2/g$.

Thermal conductivity in air (at 300 K) is extraordinarily low at 0.017-0.021 W/(mK) and a typical value of 0.02 W/(mK), which gives the aerogels high temperature stability even under extreme conditions and makes them the best thermal insulators thus far.

Silicate aerogels cannot be wetted or chemically attacked by liquid metals, so they are chemically inert to said liquid metals. The melting point of silicate aerogels is approximately 1,200° C. They are furthermore non-flammable and non-toxic. They do absorb humidity, however, and tend to crack when drying.

The modulus of elasticity ranges from 0.002-100 MPa, with a typical value of 1 MPa. (Source: https://de.wikipedia.org/wiki/Aerogel.)

Base

In this invention, base refers to the region of the bottom of the tank, above which the reference layer is located in overhead stereolithography.

Doped Aerogel

A doped aerogel, also referred to as an X-aerogel or a hybrid aerogel, is an aerogel the matrix of which is specifically "contaminated" with other molecules, similar to the doping of a semiconductor (in which, however, individual atoms are incorporated into the crystal structure). Doping with nanocellulose or a silicone, e.g. PDMS, is particularly interesting. Such doping can alter the mechanical (e.g. strength, ductility), chemical, or optical properties of an aerogel.

To do this, the doped aerogel is typically made from a liquid mixture of individual components in a sol-gel process, whereby the additives are part of the mixture. In the sol-gel process, the matrix of the aerogel is formed together and simultaneously with the addition of the additive.

Fluoropolymer

Fluoropolymers or fluoroplastics are polymers in which usually a large part or even all of the otherwise contained hydrogen atoms are replaced by fluorine. Polytetrafluoroethylene (PTFE), which is sold under the trade name Teflon, has the greatest economic significance.

Fluoropolymers have high chemical and thermal stability, good electrical insulating properties, excellent weatherability, anti-adhesive properties and are non-flammable. They are furthermore characterized by good notched impact strength and stability at high temperatures. The antiadhesive behavior results in low wettability and good sliding properties. Lastly, fluoropolymers are physiologically safe. The disadvantages are the high costs and the difficult processing. (Source: https://de.wikipedia.org/wiki/Fluorpolymere.)

Inhibitor

An inhibitor is a retardant that slows down or prevents one or more reactions. In the context of the present invention, an inhibitor is always a substance that inhibits the solidification of the substance from which an object is to be created by means of stereolithography. In the case of stereolithography of synthetic resins, oxygen, for example, often acts as an inhibitor that suppresses photopolymerization.

Pore Size

There are physical methods, such as mercury porosimetry, to determine pore diameter. However, these methods assume a specific shape of the pores (such as cylindrical holes or spherical holes arranged in rows). Mercury porosimetry is suitable for silicate aerogels. This technique involves the penetration of a non-wetting liquid, such as mercury, into a material at high pressure using a porosimeter. The pore size is determined as a function of the external pressure necessary to force the liquid into a pore against the surface tension of the liquid.

The so-called Washburn equation is valid for cylindrical pores:

$P_L - P_G = 4 \sigma \cos \theta / D_P$, in which $P_L$=pressure of the liquid, $P_G$=pressure of the gas to be displaced, $\sigma$=surface tension of the liquid, $\theta$=contact angle of the liquid on the wall material of the pores, and $D_P$=pore diameter.

The technique is usually performed under vacuum. The contact angle of mercury to most solids is between 135° and 142°. The surface tension of mercury at 20° C. under vacuum is 480 mN/m. When these values are entered the following is obtained:

$$D_P = 1470 \text{ kPa } \mu\text{m}/P_L.$$

As the pressure increases, so too does the cumulative pore volume. The average pore size can be determined from the cumulative pore volume. Derivation of the cumulative pore volume distribution provides a differential pore radius distribution. (Source: https://de.wikipedia.org/wiki/Quecksilberporosimetrie.)

The pore size can be measured according to the standard ISO 15901-1:2016-04, for example.

Reference plane, reference layer

In stereolithography, the reference plane, or more precisely the reference layer, refers to the layer in which a layer build-up on the object to be produced is taking place, i.e. the liquid material (e.g. synthetic resin) is photopolymerized or solidified, e.g. by illumination with a suitable light source. In the classic method (see above), this layer is located on the upper side of the workpiece just below the surface of the liquid. In the overhead process, this layer is on the underside of the workpiece.

Silicone

Silicones, chemically more accurately poly(organo)siloxanes, is a term for a group of synthetic polymers in which silicon atoms are linked via oxygen atoms.

Molecular chains and/or molecular networks can occur. The remaining free valence electrons of the silicon are saturated by hydrocarbon radicals (usually methyl groups).

Silicones thus belong to the group of organosilicon compounds. Due to their typically inorganic framework on the one hand and the organic radicals on the other hand, silicones occupy an intermediate position between inorganic and organic compounds, in particular between inorganic silicates and organic polymers. In a sense they are hybrids, and have a unique range of properties that cannot be matched by any other plastic.

Only inorganic silicon compounds occur in nature, namely silicon dioxide, silicates and silicic acid. All other silicon compounds, including silicones, are of synthetic origin. (Source: https://de.wikipedia.org/wiki/Silikone.)

Within the context of this invention, from this class of substances, polydimethylsiloxane (PDMS), which has a certain oxygen permeability, is particularly important.

Teflon AF

Manageable name for tetrafluoroethylene/bis-trifluoromethyl-difluoro-dioxolane or polytetrafluoroethylene-4,5-difluoro-2,2-bis(trifluoromethyl)-1,3-dioxole.

Teflon is polytetrafluoroethylene (PTFE), AF stands for "amorphous fluorine." (See: https://de.wikipedia.org/wiki/Kurzzeichen_%28Kunststoff%29.

Overhead Stereolithography

In the overhead method, the typical stereolithography arrangement (see above) is reversed. The workpiece hangs on a suspension device and is immersed in a tank with the liquid. The reference layer is located on the underside of the workpiece between the workpiece and the bottom of the tank. The illumination is carried out through the bottom of the tank, which is configured to be transparent to the used light. The workpiece is raised layer by layer by means of the suspension device, in the course of which new material is built up layer by layer on the underside. The lifting has to be done in a way that ensures that enough liquid flows into the reference layer before material is again solidified there. In specific embodiments of this method, creation can also proceed continuously.

The invention claimed is:

1. A container for holding a photosensitive liquid for use in a stereolithographic system in which a reference layer is exposed to radiation to create a workpiece in a layer-by-layer or continuous manner, wherein the container includes at least one element directly adjacent to the reference layer, the at least one element having at least one material that is transparent to the radiation and has open-celled pores capable of storing or receiving and releasing an inhibitor, wherein the at least one material of the at least one element is a solid having a volume, wherein at least 70% of the volume of the solid consists of the open-celled pores, and wherein the open-celled pores have a pore size between 2 and 200 nm.

2. The container according to claim 1, wherein the container for holding the photosensitive liquid is a tank; and wherein the at least one element is at least a part of a bottom of the tank.

3. The container according to claim 1, wherein the container for holding the photosensitive liquid is capable of being used in a reflected-light stereolithographic system, and wherein the at least one element is at least a part of a lid of the container.

4. The container according to claim 2, wherein the at least one element of the bottom of the tank is single-layered.

5. The container according to claim 2, comprising a packaging surrounding the tank, wherein the tank comprises the photosensitive liquid and the photosensitive liquid is shielded from the radiation by the packaging.

6. The container according to claim 1, wherein the at least one material is an aerogel.

7. The container according to claim 6, wherein the aerogel is doped.

8. The container according to claim 7, wherein the aerogel is doped with nanocellulose and/or polydimethylsiloxane.

9. The container according to claim 1, wherein the at least one element includes at least two layers of different materials.

10. The container according to claim 1, wherein the at least one element is coated with a semipermeable coating on a side which comes into contact with the photosensitive liquid.

11. The container according to claim 10, wherein the semipermeable coating comprises a fluoropolymer or a silicone.

12. The container according to claim 1, wherein the at least one element is coated with an adhesion promoter and a semipermeable membrane.

13. The container according to claim 1, wherein the at least one element is configured such that the pore size of the open-celled pores varies in at least one direction over a spatial extent of the at least one element.

14. The container according to claim 1, wherein an at least partially closed volume is formed on a side of the at least one element facing away from the photosensitive liquid.

15. The container according to claim 1, further comprising a carrier material that is transparent to the radiation, wherein the at least one element is mechanically supported by the carrier.

16. A stereolithographic system comprising the container according to claim 2.

* * * * *